United States Patent [19]

Farina et al.

[11] 4,200,824
[45] Apr. 29, 1980

[54] CIRCUIT FOR PROVIDING SAW-TOOTH CURRENT IN A COIL

[75] Inventors: Attilio Farina; Giuseppe Zappalà, both of Turin, Italy

[73] Assignee: Indesit Industria Elettrodomestici Italiana S.p.A., Turin, Italy

[21] Appl. No.: 895,414

[22] Filed: Apr. 11, 1978

[30] Foreign Application Priority Data

May 4, 1977 [IT] Italy ............................... 67991 A/77

[51] Int. Cl.$^2$ ......................... H01J 29/70; H01J 29/76
[52] U.S. Cl. ..................................... 315/408; 315/399
[58] Field of Search ......................... 315/408, 399, 407

[56] References Cited

U.S. PATENT DOCUMENTS

| | | | |
|---|---|---|---|
| 3,436,591 | 4/1969 | Grundmann | 315/408 |
| 3,906,307 | 9/1975 | Van Hattum | 315/408 |

FOREIGN PATENT DOCUMENTS

2408301  9/1974  Fed. Rep. of Germany ........... 315/408

*Primary Examiner*—Theodore M. Blum
*Attorney, Agent, or Firm*—Ladas, Parry, Von Gehr, Goldsmith & Deschamps

[57] ABSTRACT

A circuit for providing saw-tooth current, with a trace and a retrace interval, in a coil, in particular a deflection coil of a television kinescope, in which the coil is connected to a retrace condenser and a trace condenser so as to form a deflection circuit which oscillates freely during the retrace interval, is described. In this circuit, a first diode is connected parallel to the deflection circuit with such polarity as to be made conductive by the saw-tooth current during the first part of the trace interval, and the said deflection circuit is also connected parallel, by means of a second diode having such polarity as to be made conductive by the saw-tooth current during a second part of the trace interval, to a controllable switch, which is made conductive during part of the trace interval. The controllable switch is connected, by means of a first inductor, to a supply voltage source so that, during the interval in which the switch is conductive, energy is stored in the first inductor and later transferred, during the interval in which the switch is non-conductive, partly to the deflection circuit, by means of a third diode and partly to a first condenser. The main characteristic of this circuit is that means are provided whereby the energy transferred to the first condenser is subsequently restored to the supply source.

8 Claims, 3 Drawing Figures

CIRCUIT FOR PROVIDING SAW-TOOTH CURRENT IN A COIL

BACKGROUND OF THE INVENTION

The present invention relates to a circuit for providing saw-tooth current, with trace and retrace intervals, in a coil, in particular a deflection coil of a television kinescope, in which the said coil is connected to a retrace condenser and a trace condenser so as to form a deflection circuit which oscillates freely during the retrace interval; in which a first diode is connected parallel to the said deflection circuit with such polarity as to be made conductive by the saw-tooth current during a first part of the trace interval; in which the said deflection circuit is also connected parallel, by means of a second diode with such polarity as to be made conductive by the saw-tooth current during the second part of the trace interval, to a controllable switch, in particular a transistor, complete with a control electrode, connected to a source of periodic control signals which make it conductive during part of the trace interval and, finally, in which the said controllable switch is connected, by means of a first inductor, to a supply voltage source so that, during the interval in which the said switch is conductive, energy is stored in the said first inductor and later transferred, during the interval in which the said switch is not conductive, partly to the said deflection circuit, by means of a third diode, and partly to a first condenser.

A circuit of this type has already been described by A. Farina and G. Zappala in an article entitled "Self-stabilized horizontal deflection circuit", published in the 1976 No. 6 issue of the "Elettronica e Telecomunicazioni" magazine, page 237–241.

The circuit described in this article dissipates part of the energy picked up from a relatively high-voltage source (220 V) in a relatively low-voltage (12 and 24 V) auxiliary load circuit.

SUMMARY OF THE INVENTION

The aim of the present invention is to avoid having to dissipate part of the energy picked up from the supply source in an auxiliary circuit.

With this aim in view, the present invention relates to a circuit for providing saw-tooth current, with a trace and a retrace interval, in a coil, in particular a deflection coil of a television kinescope, in which the said coil is connected to a retrace condenser and a trace condenser so as to form a deflection circuit which oscillates freely during the retrace interval; in which a first diode is connected parallel to the said deflection circuit with such polarity as to be made conductive by the saw-tooth current during a first part of the trace interval; in which the said deflection circuit is also connected parallel, by means of a second diode having such polarity as to be made conductive by the saw-tooth current during a second part of the trace interval, to a controllable switch, complete with a control electrode, connected to a source of periodic control signals which make it conductive during part of the trace interval, and in which the said controllable switch is connected, by means of a first inductor, to a supply voltage source so that, during the interval in which the said switch is conductive, energy is stored in the said first inductor and is later transferred, during the interval in which the said switch is not conductive, partly to the said deflection circuit, by means of a third diode, and partly to a first condenser, wherein means are provided so that the said energy transferred to the said first condenser is subsequently restored to the said supply voltage source.

BRIEF DESCRIPTION OF THE DRAWINGS

Other objects and advantages of the present invention will be apparent from the following detailed description given with reference to the accompanying drawings which have to be considered only as non-limiting examples and in which.

DETAILED DESCRIPTION OF THE INVENTION

Figure 1:
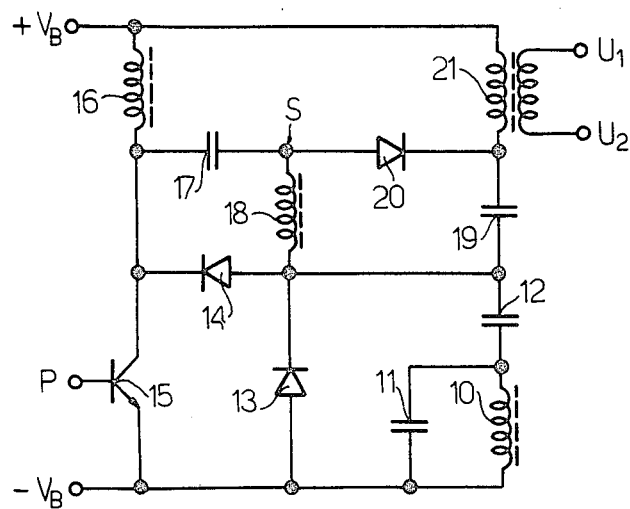
FIG. 1 shows a wiring diagram of a first circuit for providing saw-tooth current in a deflection coil, according to the principles of the present invention.

FIG. 1 shows a circuit for providing saw-tooth current in a deflection coil 10; the said circuit, for example, can be used perfectly well for providing the line deflection of a television kinescope.

A d.c. voltage supply source (obtained, for example, by rectifying and filtering the mains voltage at 220 V) is connected, with the positive and negative poles respectively, to the terminals marked $+V_B$ and $-V_B$.

Connected to terminal $-V_B$ is one end of coil 10, and parallel to the latter is connected a retrace condenser 11. Connected to the other end of coil 10 is an armature of a trace condenser 12 whose capacity is much higher than that of the retrace condenser 11. The said coil 10 with the condensers 11 and 12 forms a deflection circuit, which oscillates freely during the retrace interval and parallel to which, i.e. between the other armature of condenser 12 and the $-V_B$ terminal, there is connected a first diode 13 (connected in such a way that the deflection saw-tooth current in coil 10 will make it conductive during the first part of the trace interval, i.e. with the anode connected to the $-V_B$ terminal). Also connected parallel to the deflection circuit are a second diode 14 and NPN type transistor 15, which form a controllable switch connected in series. The base of transistor 15 is connected to a terminal P to which a control signal in the form of a rectangular signal is applied, which is repeated at line frequency and has a duration between 27 and 51 microseconds (for the sake of simplicity, let us say 32 microseconds) and which makes it conductive during a part of the trace interval.

In particular, diode 14 is arranged with such polarity that the deflection current will make it conductive during the second part of the trace interval of the sawtooth, i.e. the anode of diode 14 is connected to the cathode of diode 13, and the cathode of diode 14 is connected to the collector of transistor 15 whose emitter is connected to the $-V_B$ terminal.

The collector of transistor 15 is connected to the $+V_B$ terminal by means of a first inductor 16, and to a first armature of a first condenser 17. Connected to the common junction of diodes 13 and 14 and the deflection circuit is one end af a second inductor 18 and a first armature of a second condenser 19.

The other end of inductor 18 is connected to the second armature of condenser 17 and the anode of a third diode 20 whose cathode is connected to the second armature of condenser 19 and, through a third inductor 21, to the $+V_B$ terminal.

Connected to inductor 21 is a secondary winding with two terminals $U_1$ and $U_2$.

Figure 3:
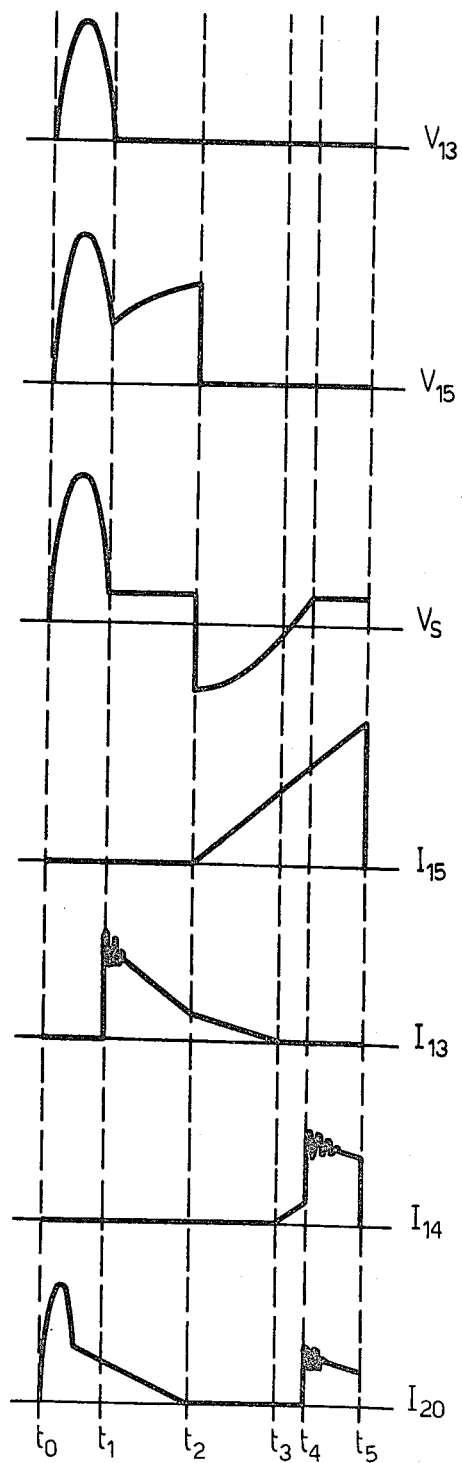
FIG. 3 shows a schematic diagram, not to scale, of the voltage and current curves at some main points on the circuit shown in FIG. 1.

The operation of the FIG. 1 circuit will now be described with reference to the diagrams shown in FIG. 3. In FIG. 3, the first line shows the behaviour of the voltage $V_{13}$ at the terminals of diode 13; the second line the behaviour of the voltage $V_{15}$ at the terminals of transistor 15; the third line the behaviour of the voltage $V_s$ between point S (common junction between condenser 17, inductor 18 and diode 20) and the terminal $-V_B$; the fourth line the behaviour of the collector current $I_{15}$ of transistor 15; the fifth line the behaviour of the current $I_{13}$ in diode 13; the sixth line the behaviour of the current $I_{14}$ in diode 14; the seventh line the behaviour of the current $I_{20}$ in diode 20.

The time axis, which is common to all, is divided into five intervals; in fact, six instants ($t_0 \ldots t_5$) are marked on it.

$t_0$ corresponds to the end of the trace interval and the start of the retrace interval; at said instant, transistor 15 is made non-conductive as a result of the control signal applied to terminal P; accordingly, as diodes 13 and 14 are both non conductive during the retrace interval ($t_0$-$t_1$), the deflection circuit (which comprises coil 10 and retrace condenser 11) oscillates freely and a half-wave (semisinusoid) of positive voltage develops at the terminals of diode 13 (see the first line of FIG. 3).

At instant $t_1$, the voltage at the terminals of diode 13 is inverted making it conductive; this marks the end of the retrace interval and the start of the trace interval in that the terminals of coil 10 (and of condenser 11) are now connected to condenser 12 the high capacity of which renders almost linear the behaviour of the current circulating in coil 10.

During the interval $t_1$-$t_2$ (initial portion of the trace interval) this current circulates in diode 13 (see the fifth line of FIG. 3).

In the meantime, the energy which had been stored in inductor 16 (during the previous cycle, when transistor 15 was conductive) flows, in the form of current, throughout the interval $t_o$-$t_2$ (retrace and initial portion of trace interval) through condenser 17 and diode 20, to charge condenser 19 (see the last line in FIG. 3: the behaviour of the current in diode 20 during the interval $t_0$-$t_2$).

Consequently, condenser 17 is charged and accordingly the voltage at the terminals of transistor 15 is the sum of the voltage at the terminal of diode 13 and that at the terminals of condensers 17 and 19 connected in series (see the second line in FIG. 3, interval $t_0$-$t_2$). It should be noted that, at $t_0$, the voltage at the terminals of condensers 17 and 19 connected in series is zero, because both diode 14 and diode 20 were conductive up to the instant $t_0$.

At $t_2$, transistor 15 is made conductive by the control pulse applied to its base by means of terminal P. Diode 20 becomes not conductive, whereas condenser 17 starts discharging through diode 13, inductor 18 and transistor 15. The discharge of condenser 17 continues up to $t_4$ (compare the $V_s$ voltage curve, line 3 of FIG. 3).

However, at $t_3$, the current in diode 13 is annulled in that, at $t_3$, the deflection current (which is increasing and directed by now so as to make conductive diode 14 and diode 13 non-conductive) is equal to the discharge current of condenser 17 (which flows in inductor 18 with such a direction as to make diode 13 conductive).

At $t_3$ therefore diode 14 starts conducting; at $t_4$, the voltage at the terminals of condenser 17 is inverted, and this renders diode 20 conductive once more; during the interval $t_4$-$t_5$, the current in inductor 18 flows through diode 20 to charge condenser 19, and the current in condenser 17 is annulled. This causes a sharp rise in the current of diode 14 which is now equal to the sum (algebraic) of the deflection current and current of inductor 18 and condenser 19. At $t_5$, transistor 15 is disabled and the cycle terminates.

The energy stored in inductor 16 during the interval in which transistor 15 is conductive (interval $t_2$-$t_5$) is partly yelded to the deflection circuit during the retrace interval ($t_0$-$t_1$) through condenser 17, diode 20 and condenser 19, and partly restored, through inductor 21, to the supply source after passing into condenser 19, part of it directly and part after passing first into condenser 17 then into inductor 18 and from there into condenser 19.

The secondary winding connected to terminals $U_1$-$U_2$ may be used for auxiliary services such as providing auxiliary voltages by rectifying and equalizing the voltage which is available at its terminals and which has the same behaviour as the voltage at the terminals of diode 13 (first line of FIG. 3). If used on a television set, the extra-high voltage for final acceleration of the kinescope or other auxiliary supply voltages can be obtained in this way using known methods.

The voltage at the terminals of diode 13 (and consequently both the deflection current and any auxiliary voltages obtained from inductor 21) can easily be stabilized, that is, made unaffected by variations in supply voltage or load, for example by sampling the voltage at the terminals of diode 13, using a known method, and controlling in relation to it the conduction time of transistor 15, that is, the length of the control pulse applied to terminal P.

Figure 2:
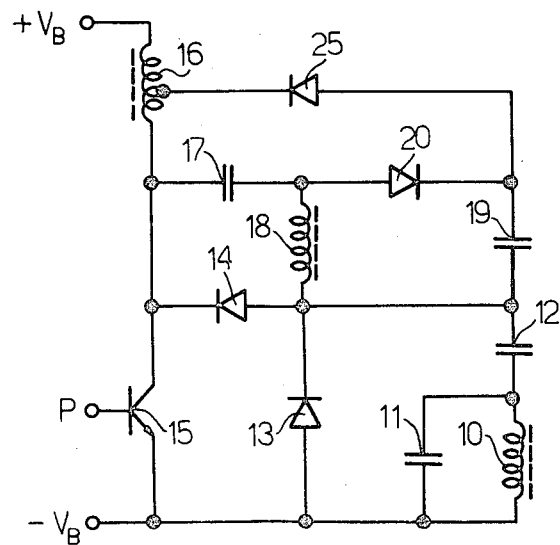
FIG. 2 shows a wiring diagram of a second circuit for providing saw-tooth current in a deflection coil, according to the principles of the present invention.

The circuit shown in FIG. 2 is more or less the same as the one shown in FIG. 1 so that only the differences need be described.

The inductor 21 of FIG. 1 has been removed on the FIG. 2 circuit and replaced by a fourth diode 25 whose anode is connected to the cathode of diode 20 and to a plate of condenser 19, and whose cathode is connected to an intermediate tap on inductor 16.

While, on the FIG. 1 circuit, the excess energy available in condenser 19 is restored directly to the supply source through inductor 21, on the FIG. 2 circuit this energy is restored to the source through inductor 16 which operates as an autotransformer. In fact, current flows in diode 25 during the second part of the trace interval; said current is closed, through inductor 16 and transistor 15, towards the terminal $-V_B$ connected to the negative pole of the supply source.

The autotransforming effect in inductor 16 causes a corresponding current to flow from inductor 16 into the supply source, through terminal $+V_B$.

The Table below shows indicative ratings for the main parts used on the FIGS. 1 and 2 circuits:

FIG. 1 circuit:
inductor 16: 9.3 mH
condenser 17: 0.1 $\mu$F
inductor 18: 1.4 mH
inductor 21: 8.3 mH
condenser 19: 1.8 $\mu$F
condenser 12: 1.8 $\mu$F condenser 11: 47 nF
coil 10: 300 μH
FIG. 2 circuit:
inductor 16: 21 mH, with ⅓ tap
condenser 17: 27 nF
inductor 18: 1.7 mH
condenser 19: 220 μF
condenser 12: 1.8 μF
condenser 11: 47 nF
coil 10: 300 μH The advantages of the circuit according to the invention will be clearly seen from the description given; it is obvious also that variations can be made to the circuits described by way of example, without, however, departing from the scope of the principles of novelty of the inventive idea.

What we claim is:

1. In a circuit for providing saw-tooth current, with a trace and a retrace interval, in a coil, in particular a deflection coil of a television kinescope, in which the said coil is connected to a retrace condenser and a trace condenser so as to form a deflection circuit which oscillates freely during the retrace interval; in which a first diode is connected parallel to the said deflection circuit with such polarity as to be made conductive by the saw-tooth current during the first part of the trace interval; in which the said deflection circuit is also connected parallel, by means of a second diode having such polarity as to be made conductive by the saw-tooth current during a second part of the trace interval, to a controllable switch, with a control electrode, connected to a source of periodic control signals which make it conductive during part of the trace interval; and, finally, in which the said controllable switch is connected by means of a first inductor, to a supply voltage source so that, for each period of said saw-tooth current, during the interval in which the said switch is conductive energy is stored in the said first inductor and later transferred, during the interval in which the said switch is non-conductive, partly to the said deflection circuit by means of a third diode, and partly to a first condenser connected directly at one side to a common junction of said switch, said second diode and said first inductor and connected directly at the other side to said third diode, the improvement wherein energy restoring means are provided, operative in the non-conductive interval of said switch subsequent to the transfer of said energy to said first condenser, for restoring the energy transferred to said first condenser to said supply means.

2. The circuit of claim 1, wherein said energy to be restored to said supply source is transferred from said first condenser to a second inductor, from there to a second condenser and, finally, to the said supply source through a third inductor constituting said energy restoring means.

3. The circuit of claim 2, wherein
the said first condenser and the said second inductor are connected to the said second condenser and to the said third inductor through the said third diode and wherein the said third inductor is connected to a terminal of the said supply source.

4. The circuit of claim 3, wherein
the said third inductor is connected to a positive terminal of the said supply source.

5. The circuit of claim 3, wherein
the said third inductor is coupled to a supply winding of an auxiliary load.

6. The circuit of claim 2, wherein the said first condenser and the said second inductor are connected to the said second condenser through the said third diode and wherein the said second condenser is connected, through a fourth diode, to an intermediate tap of the said first inductor which also provides the said third inductor.

7. The circuit of claim 3, wherein the said first condenser is connected, with its ends, to the series connection of a circuit comprising the said controllable switch, the said first diode and the said second inductor.

8. The circuit of claim 6, wherein the said first condenser is connected, with its ends, to the series connection of a circuit comprising the said controllable switch, the said first diode and the said second inductor.

* * * * *